(12) United States Patent
Sun et al.

(10) Patent No.: US 11,088,172 B2
(45) Date of Patent: Aug. 10, 2021

(54) ARRAY SUBSTRATE AND MANUFACTURING METHOD THEREOF, LIQUID CRYSTAL DISPLAY PANEL AND LIQUID CRYSTAL APPARATUS

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Le Sun, Beijing (CN); Zhengwen Pan, Beijing (CN); Zhongping Zhao, Beijing (CN); Ruijun Hao, Beijing (CN); Long Lian, Beijing (CN); Haifang Hu, Beijing (CN); Wulijibaier Tang, Beijing (CN); Tianlei Shi, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/456,362

(22) Filed: Jun. 28, 2019

(65) Prior Publication Data

US 2020/0066763 A1 Feb. 27, 2020

(30) Foreign Application Priority Data

Aug. 27, 2018 (CN) .......................... 201810979875.9

(51) Int. Cl.
*H01L 27/12* (2006.01)
*G02F 1/13357* (2006.01)
(Continued)

(52) U.S. Cl.
CPC .... *H01L 27/1218* (2013.01); *G02F 1/133606* (2013.01); *H01L 27/1296* (2013.01);
(Continued)

(58) Field of Classification Search
CPC ............. H01L 27/1218; H01L 27/1296; G02F 1/133606; G02F 2001/133614;
(Continued)

(56) References Cited

U.S. PATENT DOCUMENTS

2002/0033908 A1* 3/2002 Mori ................. G02F 1/133603
349/61
2006/0076881 A1* 4/2006 Kim ................. G02F 1/133617
313/496
(Continued)

FOREIGN PATENT DOCUMENTS

CN 106842731 A 6/2017
CN 106848026 A 6/2017
(Continued)

OTHER PUBLICATIONS

The First Office Action with Search Report dated Nov. 3, 2020 corresponding to Chinese application No. 201810979875.9.

*Primary Examiner* — Vu A Vu
(74) *Attorney, Agent, or Firm* — Nath, Goldberg & Meyer; Joshua B. Goldberg

(57) ABSTRACT

The present disclosure provides an array substrate and a manufacturing method thereof, a liquid crystal display panel, and a liquid crystal display apparatus, which can solve a problem that an independent backlight of the related liquid crystal display device is easy to cause light leakage, resulting in a thicker product. Both a light emitting structure and an array structure are disposed on the array substrate of the present disclosure, wherein a control device of the light emitting structure can control the light emitting source to (Continued)

emit light. That is, in the present disclosure, the light emitting structure is directly formed in the array substrate, which is equivalent to a built-in light emitting source, so that it is no longer necessary to adhere an external backlight, and no adhesive gap is generated to cause light leakage, and the thickness of the product can be reduced.

15 Claims, 2 Drawing Sheets

(51) Int. Cl.
  *G02F 1/1335* (2006.01)
  *G02F 1/1362* (2006.01)
(52) U.S. Cl.
  CPC .......... *G02F 1/1336* (2013.01); *G02F 1/1362* (2013.01); *G02F 1/133605* (2013.01); *G02F 1/133614* (2021.01); *G02F 1/136209* (2013.01)

(58) Field of Classification Search
  CPC ......... G02F 1/136209; G02F 1/133602; G02F 1/1336; G02F 1/133605; G02F 1/1362
  USPC .......................................................... 257/72
  See application file for complete search history.

(56) References Cited

U.S. PATENT DOCUMENTS

| | | | |
|---|---|---|---|
| 2014/0043565 A1* | 2/2014 | Ma | G02F 1/133602 349/67 |
| 2018/0059310 A1* | 3/2018 | Bae | G02B 6/0055 |
| 2018/0252962 A1* | 9/2018 | Jiang | G02F 1/133514 |
| 2019/0349685 A1* | 11/2019 | Choi | H04R 1/028 |

FOREIGN PATENT DOCUMENTS

| | | |
|---|---|---|
| CN | 206557511 U | 10/2017 |
| CN | 107390428 A | 11/2017 |

* cited by examiner

ARRAY SUBSTRATE AND MANUFACTURING METHOD THEREOF, LIQUID CRYSTAL DISPLAY PANEL AND LIQUID CRYSTAL APPARATUS

CROSS-REFERENCE TO RELATED APPLICATIONS

The present disclosure claims priority to Chinese Patent Application No. 201810979875.9, filed on Aug. 27, 2018, the entire disclosure of which is hereby incorporated by reference.

TECHNICAL FIELD

The present disclosure relates to the field of display technology, and in particular, to an array substrate and a manufacturing method thereof, a liquid crystal display panel and a liquid crystal apparatus.

BACKGROUND

Thin Film Transistor Liquid Crystal Display (TFT-LCD) has characteristics such as small size, low power consumption, no radiation, and has been rapidly developed in recent years and has made great progress in screen size and display quality.

SUMMARY

The present disclosure provides an array substrate for a liquid crystal display panel, including a base substrate, a light emitting structure on a side of the base substrate, and an array structure on a side of the light emitting structure distal to the base substrate, the array structure including pixel units arranged in an array and driving circuits for the pixel units, wherein the light emitting structure includes a light emitting source and a control device for controlling the light emitting source to emit light.

In some embodiments, the light emitting source includes a plurality of fluorescent light emitting devices arranged in a matrix, and the control device includes a plurality of controllers in one-to-one correspondence with the fluorescent light emitting devices.

In some embodiments, the fluorescent light emitting devices are in one-to-one correspondence with the pixel units.

In some embodiments, a light blocking material is filled between adjacent fluorescent light emitting devices.

In some embodiments, the light emitting structure further includes a reflective coating between the base substrate and the light emitting source.

In some embodiments, the control device is on a side of the light emitting source proximal to the base substrate.

In some embodiments, the light emitting structure further includes a planarization layer between the control device and the light emitting source.

In some embodiments, the light emitting structure further includes a light diffusing layer located on a side of the light emitting source distal to the base substrate.

In some embodiments, the array substrate further includes a protective layer between the light emitting structure and the array structure.

In some embodiments, the base substrate is a glass base substrate.

In some embodiments, the light emitting source includes a fluorescent light emitting layer.

In some embodiments, the controller includes a light emitting diode.

The present disclosure further provides a manufacturing method of an array substrate, including: forming a light emitting structure on a side of a base substrate; forming an array structure on a side of the light emitting structure distal to the base substrate, wherein forming the light emitting structure on the side of the base substrate includes forming, on the side of the base substrate, a light emitting source and a control device for controlling the light emitting source to emit light, and forming the array structure on the side of the light emitting structure distal to the base substrate includes forming pixel units arranged in a matrix and driving circuits for the pixel units.

In some embodiments, the light emitting source includes a plurality of fluorescent light emitting layers, and forming the light emitting source further includes: coating a fluorescent paste on the side of the base substrate to form the fluorescent light emitting layers.

DETAILED DESCRIPTION

In order to enable those skilled in the art to better understand the technical solutions of the present disclosure, the present disclosure will be further described in detail below in conjunction with the drawings and specific embodiments.

At present, due to a liquid crystal display panel being unable to emit light by itself, a separate backlight needs to be added to a back of the liquid crystal display panel to realize display. That is to say, the liquid crystal display panel of the related art requires an external backlight. Backlights commonly used in the related art include direct-lit backlights and side-lit backlights. The direct-lit backlight generally includes a light guide plate and a plurality of light emitting diodes (LEDs) arranged in a matrix and on a light-incident surface of the light guide plate. In order to make the light emitted by the direct-lit backlight uniform, during arranging the LEDs, there is a certain distance between a light exit side of the LED and the light guide plate, so as to ensure that the light emitted by adjacent LEDs can be mixed, so that the finally emitted light is uniform. The side-lit backlight generally includes: a light guide plate and an LED light bar at a side of the light guide plate. Specifically, the light emitted by the LED light bar is incident from the light incident surface of the light guide plate, and is totally reflected inside the light guide plate, and mesh points on the light exit surface of the light guide plate destroy the total reflection of the light inside the light guide plate, so that the light is uniformly emitted from the light exit surface of the light guide plate, and a point light source is converted into a surface light source.

However, if the external backlight and the display panel are not firmly bonded, it is easy to cause light leakage. In addition, whether it is a direct-lit backlight or a side-lit backlight, it must keep a certain thickness to increase uniformity of output light, which limits the thinness of display products.

Figure 1:
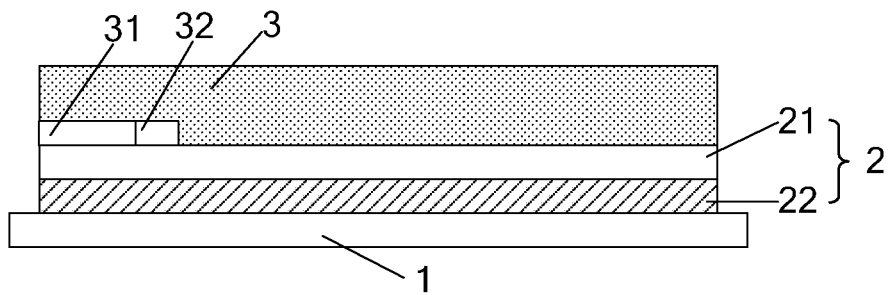
FIG. 1 is a schematic structural view of an array substrate according to an embodiment of the present disclosure.

An embodiment of the present disclosure provides an array substrate, which is an array substrate for a liquid crystal display panel. As shown in FIG. 1, the array substrate includes a base substrate 1, and a light emitting structure 2 and an array structure 3 sequentially disposed on a side of the base substrate 1, the array structure 3 includes pixel units arranged in an array and driving circuits for the pixel units. The light emitting structure 2 includes a light emitting source 21 and a control device 22 for controlling the light emitting source 21 to emit light.

Both the light emitting structure 2 and the array structure 3 are disposed in the array substrate of the present embodiment, wherein the control device 22 of the light emitting structure 2 can control the light emitting source 21 to emit light. In the present embodiment, the light emitting structure 2 is directly formed in the array substrate, that is, the light emitting source 21 is a built-in light emitting source 21, so that it is no longer necessary to adhere an external backlight, and no adhesive gap is generated and light leakage is avoided, and the thickness of the product can be reduced.

Figure 2:
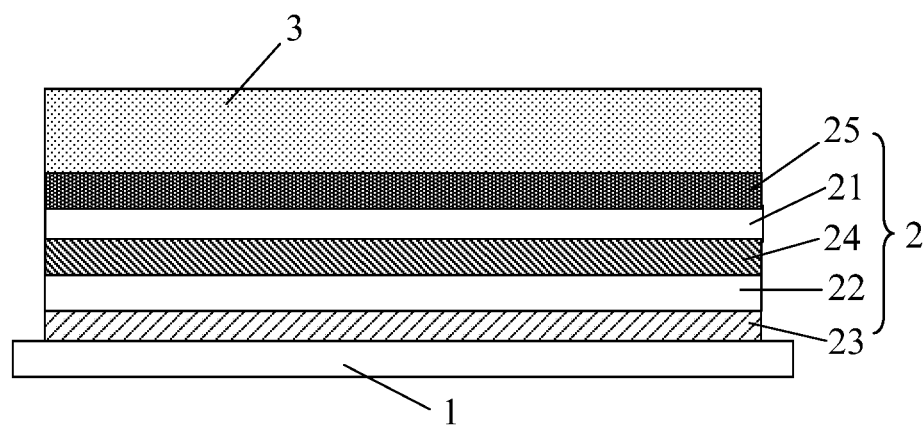
FIG. 2 is a cross-sectional structural view of an array substrate according to another embodiment of the present disclosure.
Figure 3:
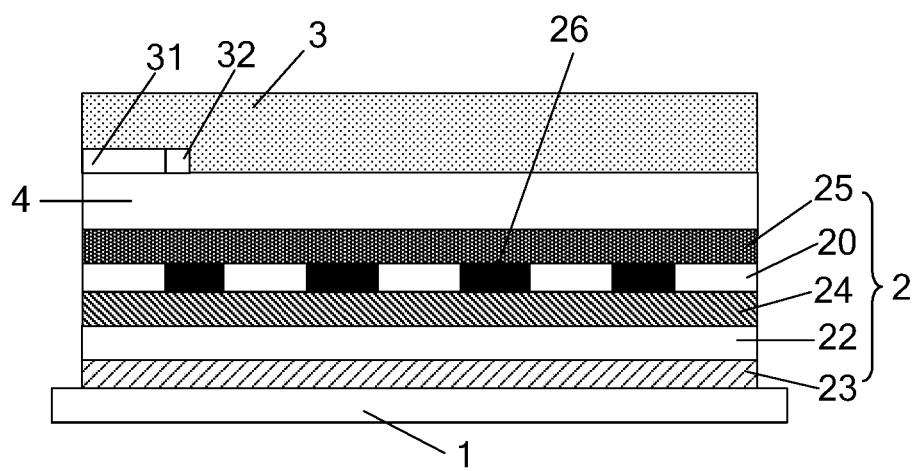
FIG. 3 is a cross-sectional structural view of an array substrate according to another embodiment of the present disclosure.

Another embodiment of the present disclosure provides an array substrate, which is an array substrate for a liquid crystal display panel, as shown in FIGS. 2 and 3, the array substrate includes a base substrate 1, and a light emitting structure 2 and an array structure 3 sequentially disposed on a side of the base substrate 1. The array structure 3 includes pixel units 31 arranged in an array and driving circuits 32 for the pixel units. The light emitting structure 2 includes a light emitting source 21 and a control device 22 for controlling the light emitting source 21 to emit light, and the light emitting source 21 is a fluorescent light emitting layer.

The built-in light emitting source 21 in the present embodiment is made of a layered fluorescent material, so that the light emitting source is a surface light emitting source, and light of the surface light emitting source does not need to be mixed, so the thickness of the final display product is not increased. Specific thickness of the fluorescent light emitting layer is not limited herein (the thickness refers to a dimension in a direction perpendicular to the base substrate 1), and may be selected or adjusted according to actual needs. For example, the thickness of the fluorescent light emitting layer may be designed to be in a range from 100 nm to 90 μm.

The light emitting structure 2 and the array structure 3 of the present embodiment may share a same power source. Specifically, a flexible circuit board for transmitting power to the control device 22 and a flexible circuit board for transmitting power to the array structure 3 may be bonded together, so that voltages are supplied to the control device 22 and array structure 3 from a same power source.

As a specific implementation in the present embodiment, the fluorescent light emitting layer may be formed by coating a fluorescent paste.

That is to say, the fluorescent light emitting layer may be generally formed by first mixing phosphor and encapsulant to form a fluorescent gel, and then coating the fluorescent gel to form a film structure. The phosphor in the present embodiment may be selected from a calcium halophosphate phosphor or a rare earth trichromatic phosphor.

In the present embodiment, specific material of the base substrate 1 is not limited, and a resin base substrate 1 may be selected, or a base substrate 1 made of a flexible material may be selected. Alternatively, in an embodiment, the base substrate 1 may be a glass base substrate, and a primary function of the glass base substrate is to provide a base substrate for coating other layers.

The array substrate of the present embodiment no longer needs a light guide plate, and compared with the related art where a PC light guide plate is disposed under the array substrate to homogenize the light emitted by the backlight, the base substrate made of glass is formed at the bottom of the array substrate of the present embodiment, that is, the PC material is replaced with glass, and advantages of high transmittance, high hardness, and difficulty in scratching are realized. In addition, the design of the light emitting source 21 of the present embodiment is equivalent to a built-in direct-lit light emitting source, which does not cause light loss. This design is more advantageous for improving the light efficiency of the light emitting source and realizing a high-brightness backlight.

In an embodiment, the light emitting source 21 may include a plurality of fluorescent light emitting devices 20 arranged in a matrix, and the control device 22 includes controllers disposed in one-to-one correspondence with the fluorescent light emitting devices 20.

Figure 4:
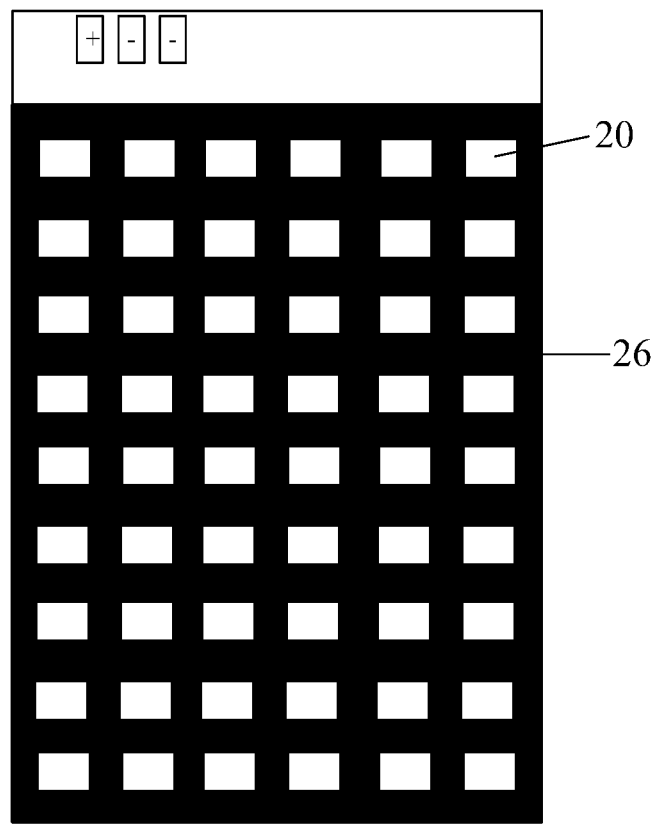
FIG. 4 is a top view of an array substrate according to another embodiment of the present disclosure.

That is to say, the fluorescent light emitting layer may be an entire layer structure formed by coating, or a layer having a pattern as shown in FIG. 4, that is, the fluorescent light emitting layer may include a plurality of fluorescent light emitting devices 20, an advantage of patterning the fluorescent light emitting layer is that the respective fluorescent light emitting devices 20 can be individually controlled, which is equivalent to control the fluorescent light emitting layer in regions. It can be understood that the fluorescent light emitting layer may include 6*9 fluorescent light emitting devices 20 as shown in FIG. 4, and may also include more fluorescent light emitting devices 20 with smaller sizes according to actual processes and needs.

In the present embodiment, the controller may be a chip, and in actual applications, a plurality of chips may be formed to control the respective fluorescent light emitting devices 20. More specifically, the chip may be a sapphire-based chip. In the present embodiment, the chip and the fluorescent light emitting layer are equivalent to a miniature light emitting diode, and the chip is a semiconductor wafer. The semiconductor wafer is composed of two parts, one part is a P type semiconductor mainly including holes, and the other part is an N type semiconductor mainly including electrons. In a case where the two semiconductors are coupled, a P-N junction is formed between them. When a current is applied to the wafer through a wire, electrons are pushed from the N region to the P region, and recombine with the holes in the P region, and then energy is emitted in the form of photons to emit light. The wavelength of light determines the color of the light.

In the present embodiment, specific design of the controller is not limited, and multiple chips may be disposed in a single layer. In an embodiment, the controller is disposed on a side of the fluorescent light emitting layer proximal to the base substrate 1. Thus the controller does not affect the light emitting of the light exit surface.

In an embodiment, the fluorescent light emitting devices 20 are disposed in one-to-one correspondence with the pixel units.

That is, each of the fluorescent light emitting devices 20 may correspond to any sub-pixel of R, G, and B sub-pixels of one array structure 3, i.e., each of the R, G, and B sub-pixels has its own fluorescent light emitting device 20 to provide backlight. This makes it possible to individually control the brightness and chromaticity of each sub-pixel.

In an embodiment, the adjacent fluorescent light emitting units 20 are filled with a light blocking material 26 therebetween.

The light blocking material 26 may be disposed in a layer the same as that of the fluorescent light emitting device 20, and the function of the light blocking material 26 is to prevent any fluorescent light emitting device 20 from affecting the luminance and chromaticity of another fluorescent light emitting device 20 adjacent thereto.

In an embodiment, the light emitting structure 2 further includes a reflective coating 23 disposed between the base substrate 1 and the fluorescent light emitting layer.

The reflective coating 23 is used to reflect the light emitted by the light emitting source 21 back to the base substrate 1, which can increase the light exiting from the side of the light source 21 distal to the base substrate 1, that is, the reflective coating 23 can function as a reflective sheet. The reflective coating 23 may be a metal layer directly formed on the glass base substrate 1, for example, it may be a coating of Ag. Further, an advantage of forming the plating film made of Ag on the glass base substrate 1 is that the defects of the conventional reflecting sheet due to assembly misalignment, film wrinkles, and the like can be reduced.

In an embodiment, the light emitting structure 2 further includes a planarization layer 24 disposed between the fluorescent light emitting layer and the controllers.

The planarization layer 24 may be made of a material having a high transmittance (for example, silicon oxide, silicon nitride, or the like). It should be noted that the planarization layer 24 is not necessary. In a case where there is a large step difference in a layer where the chip (controller) is located, the planarization layer 24 may be disposed, and in a case where there is a small step difference in the layer where the chip (controller) is located, it is not necessary to provide the planarization layer 24.

In an embodiment, the light emitting structure 2 further includes a light diffusing layer 25 disposed on a side of the fluorescent light emitting layer distal to the base substrate 1.

The light diffusing layer 25 may be a film layer formed of a material such as acrylic, polystyrene, or polycarbonate, and the light diffusing layer 25 has heat resistance, dimensional stability, and durability, and can realize optimized light diffusion effect.

In an embodiment, a protective layer 4 is further disposed between the light emitting structure 2 and the array structure 3.

That is to say, after the formation of the light emitting structure 2, the protective layer 4 is added in order to avoid damage to the already formed light emitting structure 2 during forming the array structure 3.

In the drawings corresponding to the present embodiment, the shown dimensions, thicknesses, and the like of the respective structural layers are only illustrative but not limited. In the manufacturing processes, areas of orthographic projections of the structural layers on the base substrate 1 may be the same or different from each other, and required areas of the orthographic projections of the structural layers may be realized by different processes. Meanwhile, the structure shown in the drawings does not limit geometric shapes of the structural layers, for example, the structural layer may be of a rectangle as shown in the drawings, or may be of a trapezoidal shape or a shape formed by other etching.

Figure 5:
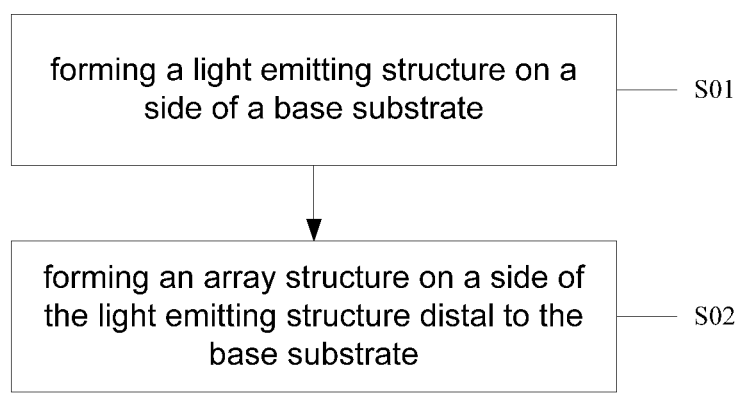
FIG. 5 is a flow chart of a manufacturing method of an array substrate according to another embodiment of the present disclosure.

Another embodiment of the present disclosure provides a manufacturing method of an array substrate. As shown in FIG. 5, the manufacturing method mainly includes the following manufacturing steps S01 and S02.

At step S01, a light emitting structure 2 is formed on a side of the base substrate 1, wherein the base substrate may be a glass base substrate.

Specifically, the step S01 may specifically include steps S01b, S01d, S01f, and S01g.

At step S01b, a control device for controlling the light emitting source to emit light is formed on the side of the base substrate 1. Specifically, a structure of a sapphire-based chip (i.e., the light emitting diode) may be formed as the control device by using a yellow light process.

At step S01d, a light emitting source 21 is formed on a side of the control device distal to the base substrate. Specifically, an encapsulant and a phosphor may be mixed to obtain a fluorescent gel, and the fluorescent gel is injected by a gel injection process to form the light emitting source. The encapsulant may be silicone rubber, which has the advantages of colorless and transparent, no low molecular by-products, low stress, deep vulcanization, non-corrosion, easy control of crosslinked structure, small shrinkage of vulcanized products, etc. The silicone rubber can be vulcanized at a room temperature, and can also be vulcanized by heating. The cured silicone rubber has excellent properties such as cold and thermal shock resistance, high temperature aging resistance and ultraviolet radiation resistance. Certainly, it is also possible to dissolve a solid phosphor in a liquid to form a fluorescent light emitting layer by a coating process, wherein the fluorescent light emitting layer can be patterned to form a plurality of fluorescent light emitting devices.

At step S01f, a light diffusing layer is formed on a side of the light emitting source 21 distal to the base substrate. Specifically, diffusion particles may be dissolved in a resin, which then is coated by a PECVD process to form the light diffusing layer.

At step S01g, a protective layer is formed on a side of the light diffusing layer distal to the base substrate. Specifically, the protective layer may be formed of a non-metallic material having non-conductivity and good transmittance, such as silicon oxide or silicon nitride, by a PECVD method.

At step S02, pixel units in an array and driving structures for the pixel units are formed on a side of the formed light emitting structure 2 distal to the base substrate.

In addition, in an embodiment, before the step S01b, the manufacturing method may further include the step S01a: forming a reflective coating on a side of the base substrate 1, and specifically, a coating of Ag may be formed on the glass base substrate by a sputtering process. An advantage of directly coating by a sputtering process is that occurrence of defects in the related art due to assembly misalignment, film wrinkles and the like can be reduced.

In an embodiment, after the step S01b and before the step S01d, the manufacturing method may further include a step S01c: a planarization layer is formed on a side of the control device distal to the base substrate, specifically, a material (such as silicon oxide, silicon nitride, etc.) with high transmittance may be selected and a plasma enhanced chemical vapor deposition (PECVD) process may be performed to form a film of silicon oxide or silicon nitride. The resulted planarization layer is located between the control device and the light emitting source.

In an embodiment, after the step S01d, the manufacturing method may further include a step S01e: a light blocking layer is formed between adjacent fluorescent light emitting devices by using a light blocking material. In the present embodiment, the description has been made in the order of first forming the fluorescent light emitting device and then forming the light blocking layer, but the present disclosure is not limited thereto, and in another embodiment, the light blocking layer may be first formed and then the fluorescent light emitting device may be formed.

In an embodiment, after the step S02, the manufacturing method may further include a step S03: the control device and the driving circuits for the pixel units are bonded to a power line.

Yet another embodiment of the present disclosure provides a liquid crystal display panel including the above array substrate.

Another embodiment of the present disclosure provides a liquid crystal display apparatus including the above array substrate. The display apparatus may be any product or component having a display function, such as an electronic paper, a mobile phone, a tablet computer, a television, a display, a notebook computer, a digital photo frame, a navigator, and the like.

The liquid crystal display apparatus provided by the present disclosure is less likely to leak light and has a smaller product thickness than that of the liquid crystal display apparatus with an external independent backlight in the related art.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and essence of the present disclosure, which are also to be regarded as falling within the scope of the present disclosure.

What is claimed is:

1. An array substrate for a liquid crystal display panel, comprising a base substrate, a light emitting structure on a side of the base substrate, and an array structure on and in direct contact with a surface of the light emitting structure distal to the base substrate, the array structure comprising pixel units arranged in an array and driving circuits for the pixel units, wherein the light emitting structure comprises a light emitting source and a control device for controlling the light emitting source to emit light,
   wherein the control device is between the light emitting source and the base substrate, and
   the light emitting source is a surface light emitting source.

2. The array substrate according to claim 1, wherein the light emitting source comprises a plurality of fluorescent light emitting devices arranged in a matrix, and the control device comprises a plurality of controllers in one-to-one correspondence with the fluorescent light emitting devices.

3. The array substrate according to claim 2, wherein the fluorescent light emitting devices are in one-to-one correspondence with the pixel units.

4. The array substrate according to claim 2, wherein a light blocking material is filled between adjacent fluorescent light emitting devices.

5. The array substrate according to claim 1, wherein the light emitting structure further comprises a reflective coating between the base substrate and the light emitting source.

6. The array substrate according to claim 1, wherein the light emitting structure further comprises a planarization layer between the control device and the light emitting source.

7. The array substrate according to claim 1, wherein the light emitting structure further comprises a light diffusing layer located on a side of the light emitting source distal to the base substrate.

8. The array substrate according to claim 1, further comprising a protective layer between the light emitting structure and the array structure.

9. The array substrate according to claim 1, wherein the base substrate is a glass base substrate.

10. The array substrate according to claim 2, wherein the light emitting source comprises a fluorescent light emitting layer.

11. The array substrate according to claim 10, wherein the controller comprises a light emitting diode.

12. A liquid crystal display panel, comprising the array substrate of claim 1.

13. A liquid crystal display apparatus, comprising the display panel of claim 12.

14. A manufacturing method of an array substrate, comprising:
   forming a light emitting structure on a side of a base substrate;
   forming an array structure on a surface of the light emitting structure distal to the base substrate, wherein the array structure is in direct contact with the surface of the light emitting structure, and wherein
   forming the light emitting structure on the side of the base substrate comprises:
   forming, on the side of the base substrate, a light emitting source and a control device for controlling the light emitting source to emit light, and
   forming the array structure on the side of the light emitting structure distal to the base substrate comprises:
   forming pixel units arranged in a matrix and driving circuits for the pixel units,
      wherein the control device is between the light emitting source and the base substrate, and
   the light emitting source is a surface light emitting source.

15. The manufacturing method of an array substrate according to claim 14, wherein the light emitting source comprises a plurality of fluorescent light emitting layers, and forming the light emitting source further comprises:
   coating a fluorescent paste on the side of the base substrate to form the fluorescent light emitting layers.

* * * * *